United States Patent
Koezuka et al.

(10) Patent No.: US 7,442,631 B2
(45) Date of Patent: Oct. 28, 2008

(54) DOPING METHOD AND METHOD OF MANUFACTURING FIELD EFFECT TRANSISTOR

(75) Inventors: Junichi Koezuka, Kanagawa (JP); Naoki Suzuki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/346,378

(22) Filed: Feb. 3, 2006

(65) Prior Publication Data

US 2006/0177996 A1     Aug. 10, 2006

(30) Foreign Application Priority Data

Feb. 10, 2005    (JP)    ............... 2005-034719

(51) Int. Cl.
    *H01L 21/425*     (2006.01)

(52) U.S. Cl. ............... 438/515; 257/E21.057; 257/E21.12; 257/E21.147; 257/E21.248; 257/E21.212

(58) Field of Classification Search ................ 438/510, 438/485, 493, 503, 505, 506, 507, 508, 509, 438/513, 514, 515, 516, 519; 257/E21.057, 257/E21.12, E21.147, E21.248, E21.212
See application file for complete search history.

(56) References Cited

U.S. PATENT DOCUMENTS

| | | |
|---|---|---|
| 4,727,044 A | 2/1988 | Yamazaki |
| 4,959,700 A | 9/1990 | Yamazaki |
| 5,064,775 A | 11/1991 | Chang |
| 5,104,818 A | 4/1992 | Silver |
| 5,132,754 A | 7/1992 | Serikawa et al. |
| 5,142,344 A | 8/1992 | Yamazaki |

(Continued)

FOREIGN PATENT DOCUMENTS

JP     05-171438     7/1993

(Continued)

OTHER PUBLICATIONS

Muller et al., Device electronics for integrated circuits, John Wiley & Sons, pp. 80 and 398, 1986.*

(Continued)

*Primary Examiner*—Matthew C. Landau
*Assistant Examiner*—Minchul Yang
(74) *Attorney, Agent, or Firm*—Nixon Peabody LLP; Jeffrey L. Costellia (57) ABSTRACT

A doping method comprising the steps of; obtaining a proportion X of ions of a compound including a donor or an acceptor impurity in total ions from mass spectrum by using a first source gas of a first concentration; analyzing a peak concentration Y of the compound in a first processing object which is doped by using a second source gas of a second concentration equal to or lower than the first concentration, referring to a dose amount of total ions as $D_0$ and setting an acceleration voltage at a value, obtaining a dose amount $D_1$ of total ions from a expression, $Y=(D_1/D_0)(aX+b)$, and doping a second processing object with the donor or the acceptor impurity by a ion doping apparatus using a third source gas, wherein a dose amount of total ions is set at $D_1$, and an acceleration voltage is set at the value.

20 Claims, 9 Drawing Sheets

U.S. PATENT DOCUMENTS

| | | |
|---|---|---|
| 5,247,190 A | 9/1993 | Friend et al. |
| 5,313,077 A | 5/1994 | Yamazaki |
| 5,315,132 A | 5/1994 | Yamazaki |
| 5,393,986 A | 2/1995 | Yoshinouchi et al. |
| 5,399,502 A | 3/1995 | Friend et al. |
| 5,514,879 A | 5/1996 | Yamazaki |
| 5,543,636 A | 8/1996 | Yamazaki |
| 5,614,732 A | 3/1997 | Yamazaki |
| 5,643,826 A | 7/1997 | Ohtani et al. |
| 5,859,445 A | 1/1999 | Yamazaki |
| 5,904,509 A | 5/1999 | Zhang et al. |
| 5,923,962 A | 7/1999 | Ohtani et al. |
| 6,011,277 A | 1/2000 | Yamazaki |
| 6,013,332 A | 1/2000 | Goto et al. |
| 6,165,876 A | 12/2000 | Yamazaki et al. |
| 6,258,638 B1 | 7/2001 | Tanabe et al. |
| 6,353,244 B1 | 3/2002 | Yamazaki et al. |
| 6,455,360 B1 | 9/2002 | Miyasaka |
| 6,960,498 B2 | 11/2005 | Nakamura |
| 2001/0034089 A1 | 10/2001 | Yamazaki et al. |
| 2003/0232465 A1 | 12/2003 | Hayakawa |
| 2004/0005745 A1* | 1/2004 | Nakamura ................ 438/174 |
| 2006/0005768 A1 | 1/2006 | Nakamura |

FOREIGN PATENT DOCUMENTS

| | | |
|---|---|---|
| JP | 07-130652 | 5/1995 |
| JP | 08-077959 | 3/1996 |
| JP | 09-106779 | 4/1997 |
| JP | 09-219173 | 8/1997 |
| JP | 10-092576 | 4/1998 |
| JP | 10-223553 | 8/1998 |
| JP | 10-302707 | 11/1998 |
| JP | 11-162397 | 6/1999 |
| JP | 2000-311867 | 11/2000 |
| JP | 2001-357813 | 12/2001 |
| JP | 2004-039936 | 2/2004 |
| WO | WO-1990/013148 | 11/1990 |

OTHER PUBLICATIONS

Qin et al., Plasma Immersion Ion Implantation Doping Using a Microwave Multipolar Bucket Plasma, IEEE Transactions on Electron Devices, vol. 39, p. 2354-2358, 1992.*

Chen et al., Study of PH3 and B2H5 ion beam species generated by inductively coupled plasma, IEEE, p. 1218-1221, 1999.*

* cited by examiner

DOPING METHOD AND METHOD OF MANUFACTURING FIELD EFFECT TRANSISTOR

BACKGROUND OF THE INVENTION

1. Field of the Invention

The present invention disclosed in this specification relates to a doping method using an ion doping apparatus which does not require mass separation of generated ions and a method of manufacturing a field effect transistor using the doping method.

2. Description of the Related Art

In a manufacturing process of a semiconductor element such as a field effect transistor, when a donor impurity or an acceptor impurity is added into a processing object such as a semiconductor film formed over a substrate having an insulating surface or a semiconductor substrate, an ion implantation apparatus or an ion doping apparatus is used. An ion implantation apparatus is a mass-separation type apparatus in which an unnecessary ion species can be separated by using a mass separator and in which a processing object placed in a treatment chamber can be subjected to only a desired ion species. Therefore, the dose amount of a desired ion species can be precisely controlled.

On the other hand, since a mass separator is not included in an ion doping apparatus, the ion doping apparatus is a non-mass-separation type apparatus in which a processing object placed in a treatment chamber is irradiated with all ions included in an ion beam (hereinafter- referred to as total ions in this specification) which is extracted from plasma generated in an ion source. Accordingly, the doze amount is counted by not only a desired ion species but also total ions including an unnecessary ion species, which makes it difficult to precisely control the doze amount of a desired ion species.

Hereinafter, an ion implantation apparatus refers to an apparatus with a mass separator, and an ion doping apparatus refers to an apparatus without a mass separator in this specification.

As a source gas, for example, $PH_3$ (phosphine) diluted with hydrogen is used in a case of using phosphorus as a donor, and $B_2H_6$ (diborane) diluted with hydrogen is used in a case of using boron as an acceptor. In an ion source, the source gas is separated into positive ions and electrons; in other words, the source gas is ionized to generate plasma. Then, an ion beam is extracted from the plasma. Since the source gas includes hydrogen as described above, a large amount of hydrogen ions is included in the generated plasma. This hydrogen ion is an unnecessary ion species.

Since the dose amount is counted by total ions including the hydrogen ions in the ion doping apparatus, a proportion of a desired ion species in total ions is varied depending on a condition of plasma even if the dose amount of total ions is not changed. In this case, the dose amount of only a desired ion species is forced to change.

In addition, the precise control of a concentration of boron in a semiconductor substrate or a semiconductor film is required in doping a portion where a channel region is formed with boron as an impurity at a low concentration, that is to say, in channel doping, in order to control a threshold voltage $V_{th}$ of a field effect transistor. However, the ion implantation apparatus is sometimes used only in a step of channel doping since the precise control is difficult to be performed with the ion doping apparatus.

Among the ion doping apparatuses, there is an ion doping apparatus including a mass spectrometer. By using the mass spectrometer, a proportion of a desired ion species can be monitored. However, when doping of boron at a low concentration is performed as in the case of channel doping, there is a problem in which ions of a compound including boron, in other words, a desired ion species is not detected by the above mass spectrometer.

The invention described in Reference 1 focuses on that a peak with high intensity due to $H_3^+$ ions is observed by using a mass spectrometer (referred to as E×B) equipped in an ion doping apparatus, even in such a condition in which doping is performed with an impurity at a low concentration (Reference 1: Japanese Patent Laid-Open No. 2004-39936). In other words, the invention attempts to control the dose amount of boron by finding a correlation between the peak intensity due to $H_3^+$ ions and a concentration of boron in a processing object, which has been measured by SIMS (secondary ion mass spectrum) analysis.

However, it is found that even when the invention described in Reference 1 is used, a concentration of boron in the processing object is not stable and the variation is not small in the condition of doping with an impurity at a low concentration. Since the dose amount of boron cannot be controlled precisely, the improvement of the above invention is required.

SUMMARY OF THE INVENTION

It is an object of the present invention disclosed in this specification to control a concentration of a donor impurity or an acceptor impurity in a processing object after doping, by a method different from that of the invention described in Reference 1 and reduce the variation of the concentration thereof. Further, it is an object to reduce a variation of a threshold voltage of a field effect transistor, for example, a thin film transistor, and control a voltage so as to be in a predetermined range.

One feature of the invention disclosed in this specification is to include a step of obtaining a dose amount $D_1$ of total ions required to obtain a peak concentration Y correspondingly to a change of a proportion X (0<X<1) of ions from a first relational expression. The proportion X is a proportion of the ions of a compound including a donor impurity or an acceptor impurity in total ions, which is measured from mass spectrum. The peak concentration Y is a peak concentration of the donor impurity or the acceptor impurity in a processing object doped with the donor impurity or the acceptor impurity. The first relational expression is a relational expression of the proportion X and the peak concentration Y. The invention also includes a step of doping a processing object with the donor impurity or the acceptor impurity by an ion doping apparatus in a condition in which a source gas used in the doping is used, a dose amount of total ions is set at a value obtained in the step, and an acceleration voltage is a same value as that of the doping.

One feature of the invention disclosed in this specification is to include a step of obtaining a dose amount $D_1$ of total ions required to obtain a threshold voltage $V_{th}$ correspondingly to a change of a proportion X(0<X<1) of ions from a first relational expression and a second relational expression. The proportion X is a proportion of the ions of a compound including a donor impurity or an acceptor impurity in total ions, which is measured from mass spectrum The threshold voltage $V_{th}$ is a threshold voltage of a field effect transistor manufactured by using a processing object which is doped with the donor impurity or the acceptor impurity. The first relational expression is a relational expression of the proportion X and a peak concentration Y of the donor impurity or the acceptor impurity in the processing object doped with the donor impurity or the acceptor impurity. The second relational expression is a relational expression of the threshold voltage $V_{th}$ and the peak concentration Y. The invention also includes a step of doping a processing object with the donor impurity or the acceptor impurity by an ion doping apparatus in a combination in which a source gas used in the doping is used, a dose amount of total ions is set at a value obtained in the step, and an acceleration voltage is a same value as that of the doping.

In a case of heavy doping using a source gas in which a compound of a donor impurity or an acceptor impurity is diluted with hydrogen to 5% to 40%, which is a first concentration, a peak due to ions of the above compound including the impurity as well as a peak due to hydrogen ions is observed by a mass spectrometer equipped in an ion doping apparatus to be used. The above-described compound of the acceptor impurity is, for example, $B_2H_6$, and the above-described compound of the donor impurity is, for example, $PH_3$. In a case of using $B_2H_6$, $B_2H_y^+$ ion (y is a positive integer) can be given as a main ion of a compound including the above impurity. The first concentration is calculated from a flow ratio of a compound of a donor impurity or an acceptor impurity included in a source gas to the source gas. The same can be applied to a second concentration to be described later. The flow ratio can be translated into a volume ratio.

In the heavy doping, a peak due to ions of a compound including a donor impurity or an acceptor impurity and a peak due to hydrogen ions can be observed by the above mass spectrometer. The number of the each peak is not limited to one. A plurality of peaks may each be observed. A proportion X (0<X<1) of the ions of the compound including the impurity included in total ions can be obtained from a ratio of a peak intensity of the ions of the compound including the above impurity to the sum of the peak intensities. For example, when peaks of $H^+$ ions, $H_2^+$ ions, $H_3^+$ ions, and $B_2H_y^+$ ions (y is a positive integer) are observed and an intensity ratio of the above peaks is 10:5:100:50, a proportion X of the $B_2H_y^+$ ions is 0.30. This is obtained by dividing 50 by 165, which is the sum of 10, 5, 100, and 50.

As a diluent gas included in the above source gas, a rare gas such as helium or argon may be used instead of using hydrogen.

In the above heavy doping, even when the dose amount of total ions is constant, a proportion X of the ions of the compound including a donor impurity or an acceptor impurity included in total ions is varied. This is because the state of plasma generated in an ion source in an ion doping apparatus is varied in accordance with time; in other words, this is because the plasma state is not stable over a long period.

After obtaining the proportion X of the above ions, a source gas is used, in which the above compound of a donor impurity or an acceptor impurity is diluted with hydrogen to a second concentration equal to or lower than the first concentration, and a processing object is doped with the above donor impurity or the acceptor impurity at a predetermined acceleration voltage without changing the ion doping apparatus to be used. At that time, a dose amount of total ions $D_0$ (cm$^{-2}$) is needed to be measured. The second concentration may be 5% or more. For example, when the first concentration is 15%, the second concentration can be 7.5%. As a diluent gas contained in the source gas, a rare gas such as helium or argon may be used instead of using hydrogen.

The processing object is a target object to be doped, such as a semiconductor film formed over a substrate having an insulating surface or a semiconductor substrate. This doping is done, for example, for a case of channel doping where the concentration or the dose amount is set to a condition of channel doping.

Then, a peak concentration Y (cm$^{-3}$) of a donor impurity or an acceptor impurity in the processing object is analyzed by an analysis method such as SIMS (secondary ion mass spectrum) analysis. The peak concentration is a maximum value of the concentration of a donor impurity or an acceptor impurity in a profile, in which the horizontal axis shows a depth of a donor impurity or an acceptor impurity from a surface of the processing object and in which the vertical axis shows a concentration of the above impurity. In the plasma state in which a proportion X of ions of a compound including a donor impurity or an acceptor impurity is obtained, since the peak concentration Y of the donor impurity or the acceptor impurity in the processing object is varied depending on the value of X, the following relational expression, which is referred to as Formula 1, can be obtained: Y=aX+b (a and b are real numbers).

The Formula 1 can be employed only when the dose amount of total ions is specific value, in other words, $D_0$, in conducting a doping process to the processing object by an ion doping apparatus. Regarding an arbitrary dose amount $D_1$ (cm$^{-2}$) of total ions, a following relational expression, which is referred to as Formula 1', can be obtained: Y=($D_1/D_0$)(aX+b). Note that $D_1/D_0$ shows a fraction in which $D_0$ is a denominator and $D_1$ is a numerator.

From the Formula 1', the dose amount $D_1$ of total ions corresponding to a desired value of a peak concentration Y of a donor impurity or an acceptor impurity can be obtained. The dose amount $D_1$ can be obtained by an electronic calculator. The dose amount of total ions is adjusted to be the above obtained value, and doping is performed to a processing object without changing the other conditions.

On the other hand, a threshold voltage $V_{th}$ (V) of a field effect transistor formed through the above doping step to the processing object is varied depending on the peak concentration Y obtained by the analysis method such as SIMS analysis or the square root of the peak concentration Y. Accordingly, a following relational expression, which is referred to as Formula 2, can be obtained: $V_{th}$=cY+d, or $V_{th}$=cY$^{1/2}$+d (c and d are real numbers).

By assigning Formula 1' to Formula 2, a relational expression, $V_{th}$=c($D_1/D_0$)(aX+b)+d, or $V_{th}$=c($D_1/D_0$)$^{1/2}$(aX+b)$^{1/2}$+d, can be obtained. Accordingly, a dose amount $D_1$ of total ions corresponding to a desired threshold voltage $V_{th}$ can be obtained. This dose amount $D_1$ can also be obtained by an electronic calculator.

In the ion doping apparatus used to obtain Formula 1, a dose amount of total ions is adjusted to be the value of $D_1$. Then, doping is performed to a semiconductor film or a semiconductor substrate, and a field effect transistor is manufactured using the semiconductor film or the semiconductor substrate. In the above-described doping, the conditions except the dose amount is set to the same as the conditions at the time of doping to the processing object analyzed by an analysis method such as SIMS analysis.

Further, comparing the condition of heavy doping with the condition of channel doping, a concentration of a compound of a donor impurity or an acceptor impurity included in a source gas, for example, $B_2H_6$ in the case of channel doping is lower than that of the case of heavy doping. Further, the dose amount of total ions in the case of channel doping is reduced. Therefore, it is important to change the conditions such as the concentration of the above compound of an impurity in a source gas to be introduced, the dose amount of total ions, or the like and stabilize the conditions after the change, when the same ion doping apparatus is used, the source gas is introduced into an ion source in an apparatus in the condition of heavy doping to generate plasma, and doping is subsequently performed in the condition of channel doping.

However, there is a problem in that the concentration of a compound of a donor impurity or an acceptor impurity in a source gas takes more time to be stabilized in comparison with the dose amount of total ions. In order to solve the problem, the following treatment process can be used.

Before doping in the condition of channel doping, supply of a source gas is stopped. Then, the gas which is introduced into an ion source in a ion doping apparatus is switched to a diluent gas, which is included in the source gas. For example, in the case of using a source gas in which $B_2H_6$ is diluted with hydrogen, it is switched to hydrogen (preferably, the concentration of $H_2$ is 100%). In a case of using a source gas in which $B_2H_6$ is diluted with argon, it is switched to argon (preferably, the concentration of Ar is 100%). Subsequently, plasma is generated in the ion source, and a first plasma treatment, in which a dummy substrate is irradiated with a generated ion beam, is performed for a predetermined period. A substrate used as the dummy substrate is a glass substrate, a silicon substrate, or the like, and it is placed on a stage in a treatment chamber (chamber) connected to a vacuum pumping system.

Subsequently, the supply of the diluent gas is stopped, and the treatment chamber is exhausted by using the vacuum pumping system. Then, a source gas, in which the compound of a donor impurity or an acceptor impurity is diluted to a lower concentration than the condition of heavy doping, is supplied to the ion source. In the condition of channel doping using this source gas, a second plasma treatment, in which the dummy substrate is irradiated with an ion beam, is performed for a predetermined period.

In a case where the first plasma treatment is not performed, the second plasma treatment is needed to be performed for approximately two hours in order to stabilize the concentration of the compound of the impurity included in the source gas. By performing the first plasma treatment, the total time required to perform the first and the second plasma treatments can be decreased to less than two hours.

After finishing the second plasma treatment, the dummy substrate on the stage is changed to a processing object to be analyzed by an analysis method such as SIMS, and the processing object is doped by the same condition of the second plasma treatment.

Comparing with a case of performing only the second plasma treatment without the first plasma treatment, the case of performing the first plasma treatment can reduce the variation of the concentration of a donor impurity or an acceptor impurity in the processing object which has been subjected to the doping process; accordingly, the variation of sheet resistance in the object can be reduced.

In accordance with the invention disclosed in this specification, the following effects can be obtained.

1) In manufacturing a field effect transistor, the aimed threshold voltage can be obtained even when an ion doping apparatus is used.
2) The variation of the threshold voltage of the manufactured field effect transistor can be reduced.
3) The variation of the peak concentration of a donor impurity or an acceptor impurity in a processing object, which has been subjected to a doping process, can be reduced by using an ion doping apparatus.
4) Even when doping is performed at a low concentration as in the case of channel doping, since an ion implantation apparatus is not needed, the manufacturing cost of a field effect transistor can be reduced.
5) When the concentration of the compound of the donor impurity or the acceptor impurity included in the source gas which is introduced to an ion doping apparatus is changed from the first concentration to the second concentration which is lower than the first concentration, the second concentration after the change can easily become stable.

DETAILED DESCRIPTION OF THE INVENTION

Embodiment Modes (Embodiment Mode 1)

An example of an ion doping apparatus used in the invention disclosed in this specification will be described with reference to FIG. 1.

Figure 1:
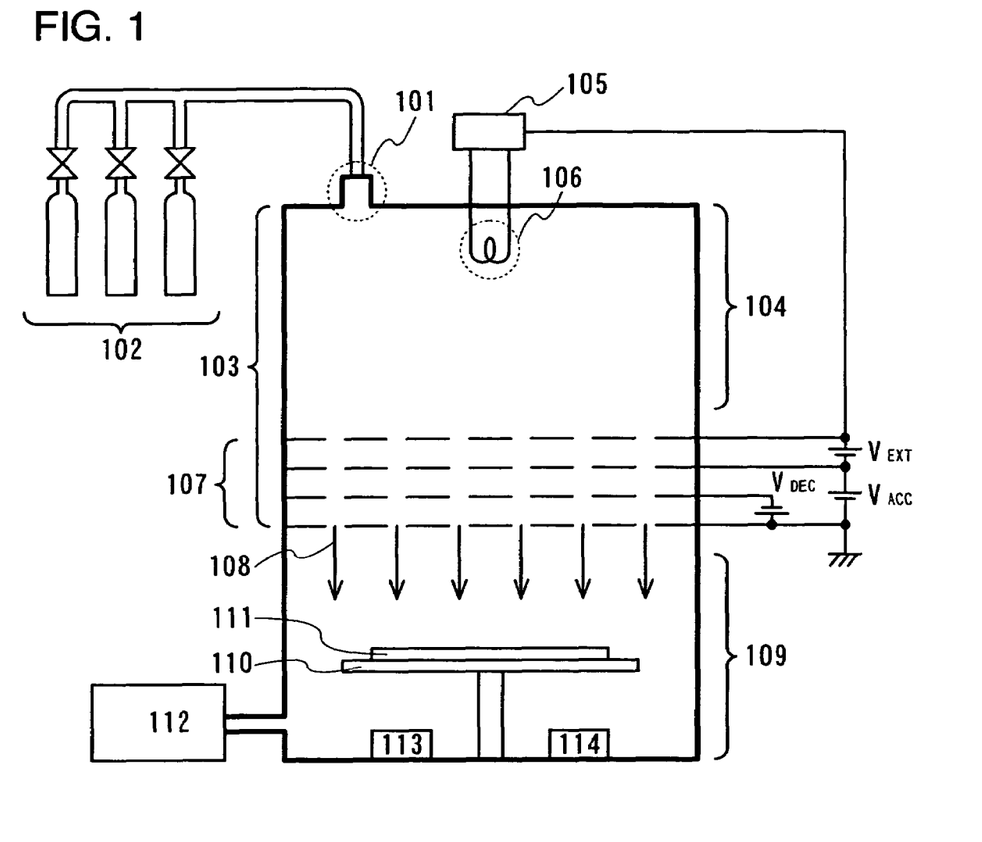
FIG. 1 is a schematic view of an ion doping apparatus.

FIG. 1 is a schematic view of an ion doping apparatus. A gas introduction port 101 is connected to a gas supply system 102 which can supply a source gas, in which $B_2H_6$ is diluted with hydrogen or a rare gas (such as helium or argon), hydrogen, or a rare gas. The source gas, hydrogen, or the rare gas is introduced to a plasma generating portion 104 in an ion source 103 from the gas supply system 102 to generate plasma in the plasma generating portion 104. The ion source 103 further includes a discharge generating means 106 and an electrode portion 107. The electrode portion 107 includes an extraction electrode, an accelerating electrode, a decelerating electrode, and an earth electrode. The electrode portion 107 is also referred to as an extraction electrode system, and the above four electrodes are each provided with a plurality of holes so that an ion beam 108 can pass therethrough. In FIG. 1, $V_{EXT}$ denotes extraction voltage, $V_{ACC}$ denotes acceleration voltage, and $V_{DEC}$ denotes deceleration voltage.

The discharge generating means 106 in FIG. 1 is a filament made of a high-melting point material typified by tungsten, which can withstand high temperature of 2000° C. or more, and is provided to be exposed in the plasma generating portion 104. The number of filaments is not limited to one as shown in FIG. 1, and a plurality of filaments can be used. The voltage is applied to the filament from a direct-current power source 105 to produce direct-current discharge, and the gas introduced in the plasma generating portion 104 is ionized to generate plasma. Instead of using the above filament, a plate electrode or an antenna having a particular shape, which is connected to a high-frequency (RF) power source, may be used to produce high-frequency discharge, so that plasma is generated.

The ion beam 108 is extracted from the plasma generated in the plasma generating portion 104, and is accelerated and irradiated to a substrate 111 on a stage 110 provided in a treatment chamber 109. The stage 110 can move in a predetermined direction, together with the substrate 111, and can be applied to a large sized substrate.

The treatment chamber 109 is provided with a mass spectrometer 113 and a dose amount measuring means 114 at a backside of (below) the stage 110. Since the stage 110 is movable as described above, the mass spectrometer 113 and the dose amount measuring means 114 can be irradiated with the ion beam 108 without being blocked by the stage 110. In addition, the treatment chamber 109 is connected to a vacuum pumping system 112 which uses a known vacuum pump such as a turbo-molecular pump. A load lock chamber may be connected to the treatment chamber 109 directly or indirectly, and a means capable of automatically transporting the substrate 111 may be provided between the load lock chamber and the treatment chamber 109.

Next, by using the ion doping apparatus shown in FIG. 1, a specific example of a process to obtain the aforementioned Formula 1, Formula 1', and Formula 2 is described below.

As the source gas introduced to the plasma generating portion 104, $B_2H_6$ diluted with hydrogen to a concentration of 5% is used, and a dose amount of total ions is set at $2.0 \times 10^{16}$ cm$^{-2}$ and an acceleration voltage is set at 80 kV. These values are the conditions of heavy doping. With these conditions, a proportion X of ions of a compound including boron in total ions is calculated from a measurement result obtained by the mass spectrometer 113.

Figure 2:
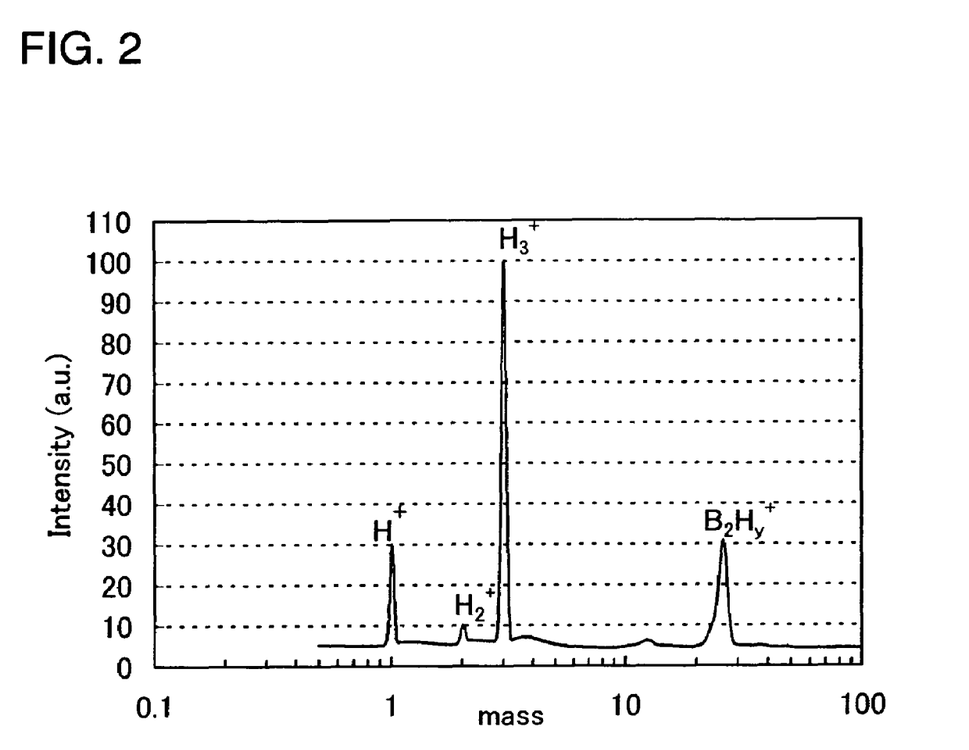
FIG. 2 shows a measurement result using a mass spectrometer.

FIG. 2 shows a measurement result by the mass spectrometer 113, i.e. mass spectrum. The horizontal axis shows the mass of ions, and the vertical axis shows the intensity. Peaks of H$^+$ ions, $H_2^+$ ions, $H_3^+$ ions, and $B_2H_y^+$ ions (y is a positive integer) in the order of increasing the mass are each measured. Besides these peaks, a peak due to $BH_x^+$ ions (x is a positive integer) is observed in some cases. However, since the amount of the $BH_x^+$ ions is much smaller than that of the $B_2H_y^+$ ions, the peak due to the $BH_x^+$ ions has much lower intensity than that due to the $B_2H_y^+$ ions and is not quantified. From the result shown in FIG. 2, a proportion X of the $B_2H_y^+$ ions is calculated to be 0.174.

Figure 3:
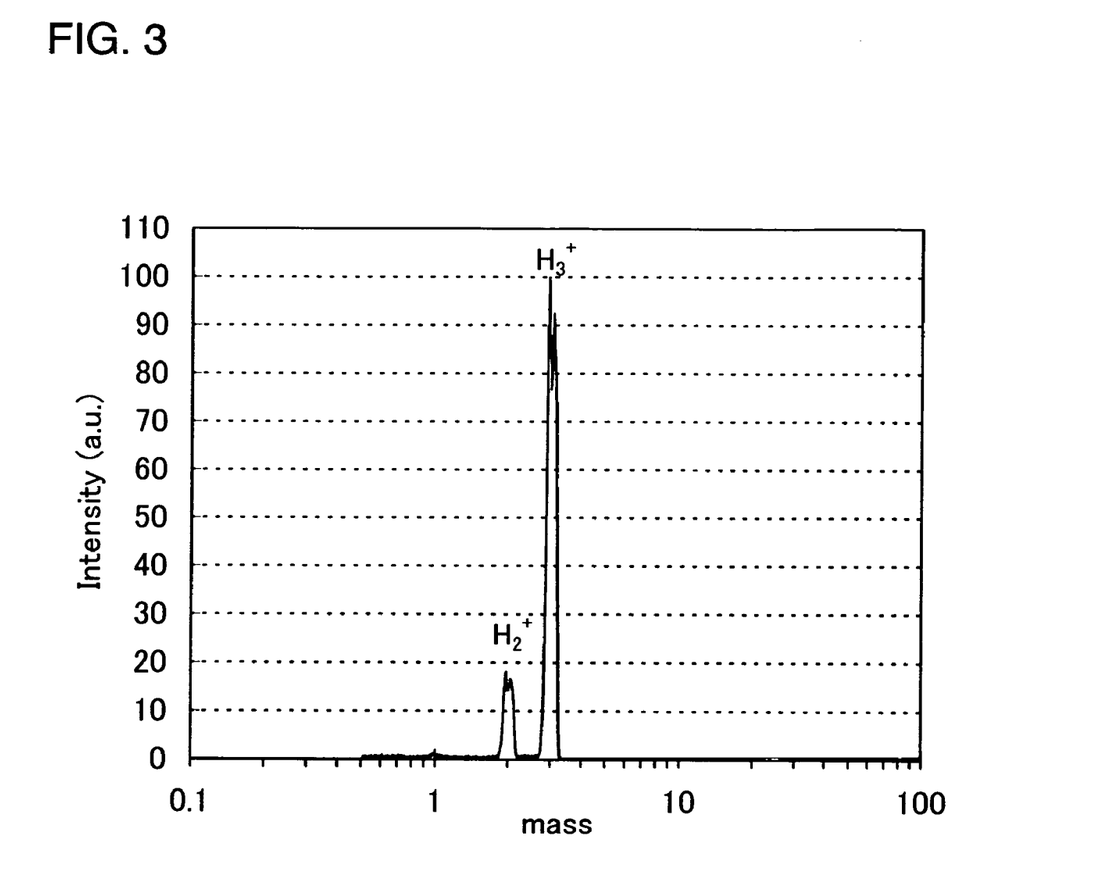
FIG. 3 shows a measurement result obtained by a mass spectrometer as a comparative example.

FIG. 3 is a graph shown as a comparative example, which shows a measurement result by the mass spectrometer 113 (mass spectrum). As a source gas, $B_2H_6$ diluted with hydrogen to a concentration of 1% is used. A dose amount of total ions is set at $1.3 \times 10^{14}$ cm$^{-2}$, and an acceleration voltage is set at 25 kV. These values are the conditions of channel doping. With these conditions, as apparently shown in FIG. 3, only the peak due to $H_2^+$ ions and the peak due to $H_3^+$ ions are measured. The peak due to the $B_2H_y^+$ ions as outstandingly shown in FIG. 2 cannot be distinguished virtually. Therefore, a proportion X of $B_2H_y^+$ ions cannot accurately obtained from the result shown in FIG. 3.

Since the amount of $B_2H_y^+$ ions in total ions depends on the concentration of $B_2H_6$ in a source gas, it is impossible to obtain the proportion X of the $B_2H_y^+$ ions with high accuracy in the case where a concentration of $B_2H_6$ is 1%. When the concentration is 5% or more, the proportion X can sufficiently obtained. Note that a material containing $B_2H_6$ at a concentration of 40% or more is not usually used as a source gas since $B_2H_6$ is a dangerous gas.

Figure 4:
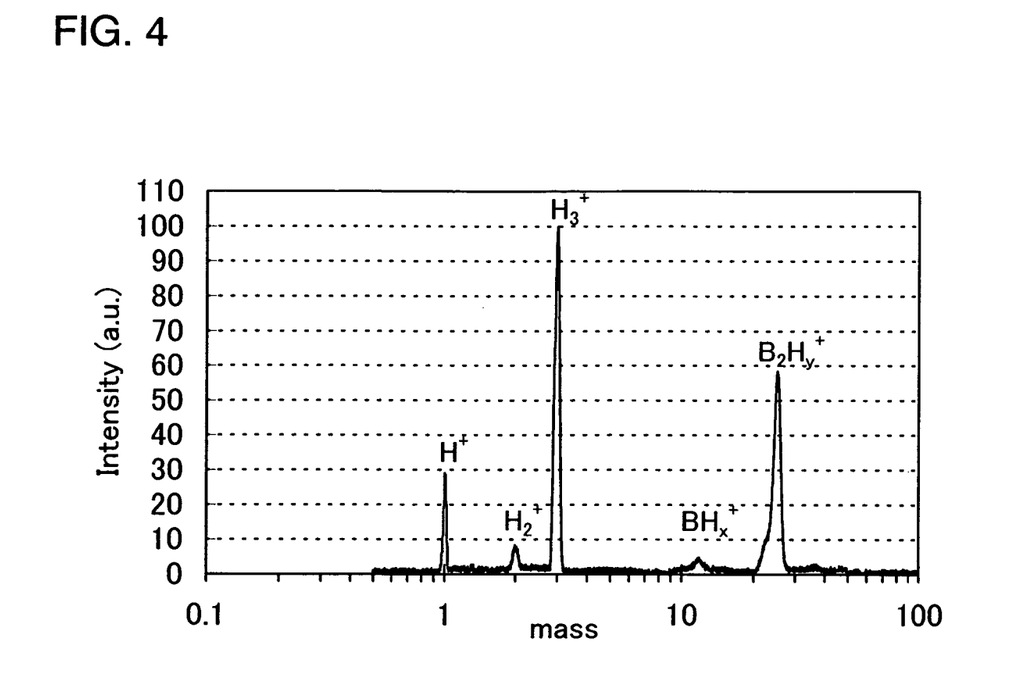
FIG. 4 shows a measurement result obtained by a mass spectrometer.
Figure 5:
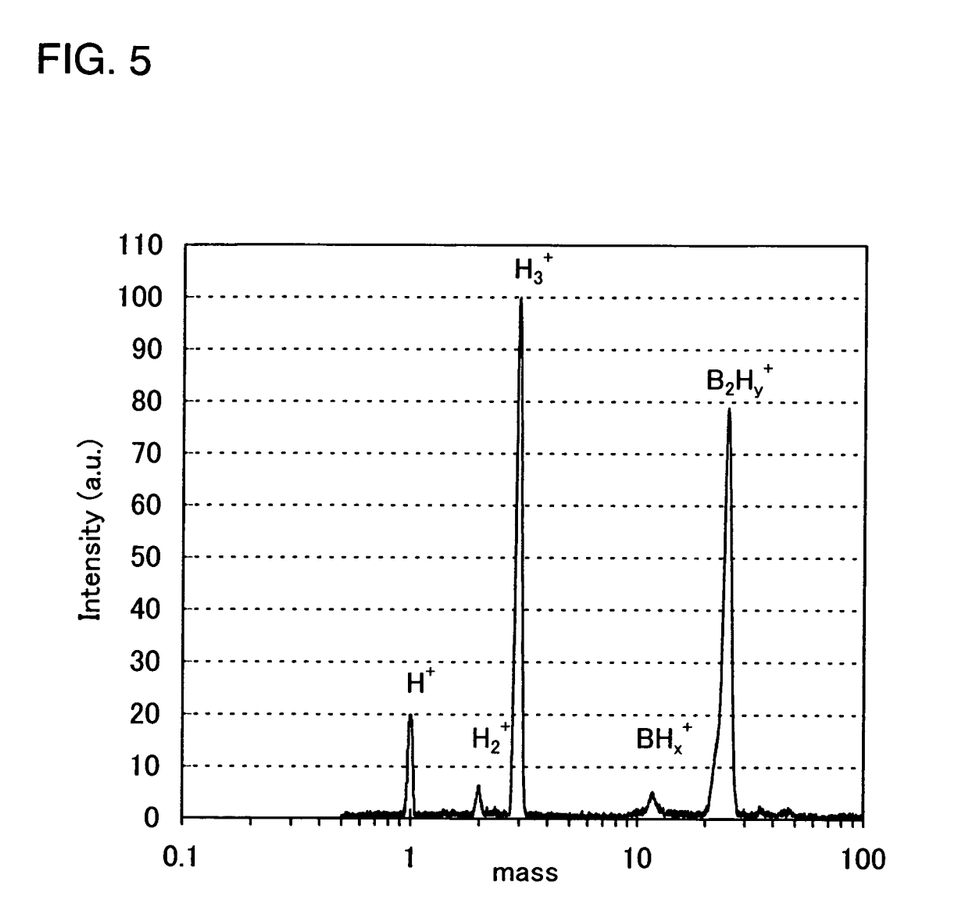
FIG. 5 shows a measurement result obtained by a mass spectrometer.

FIG. 4 and FIG. 5 are graphs showing results (mass spectrum) measured under the same condition as that of FIG. 2. From the result shown in FIG. 4, a proportion X of $B_2H_y^+$ ions is calculated to be 0.292, and from the result shown in FIG. 5, a proportion X of $B_2H_y^+$ ions is calculated to be 0.374. Further, when various proportions X of $B_2H_y^+$ ions is calculated by performing the measurement by the mass spectrometer a plurality of times, the result that the X value varies in the range of 0.1 to 0.4 is obtained.

FIG. 2, FIG. 4, and FIG. 5 are the results measured on different days, waiting one or more week between each measurement. On the other hand, when a plurality of measurements is performed on the same day by the mass spectrometer 113, the proportion X of $B_2H_y^+$ ions is not varied. The result shows that plasma state generated in the plasma generating portion 104 in the ion doping apparatus does not change in one day; however, the plasma state changes when one or more week has passed.

Next, the source gas is changed to a material in which $B_2H_6$ is diluted with hydrogen to a concentration of 1%, the dose amount of total ions is changed to $1.3 \times 10^{14}$ cm$^{-2}$, and the acceleration voltage is changed to 25 kV A glass substrate over which a semiconductor film containing silicon as its main component is formed is placed as the substrate 111 on the stage 110, and doping is performed to the semiconductor film. In this doping step, a plasma state in which a proportion X of $B_2H_y^+$ ions is made is maintained. After the doping, a peak concentration Y (cm$^{-3}$) of boron in the semiconductor film is analyzed by SIMS in this embodiment mode.

Figure 6:
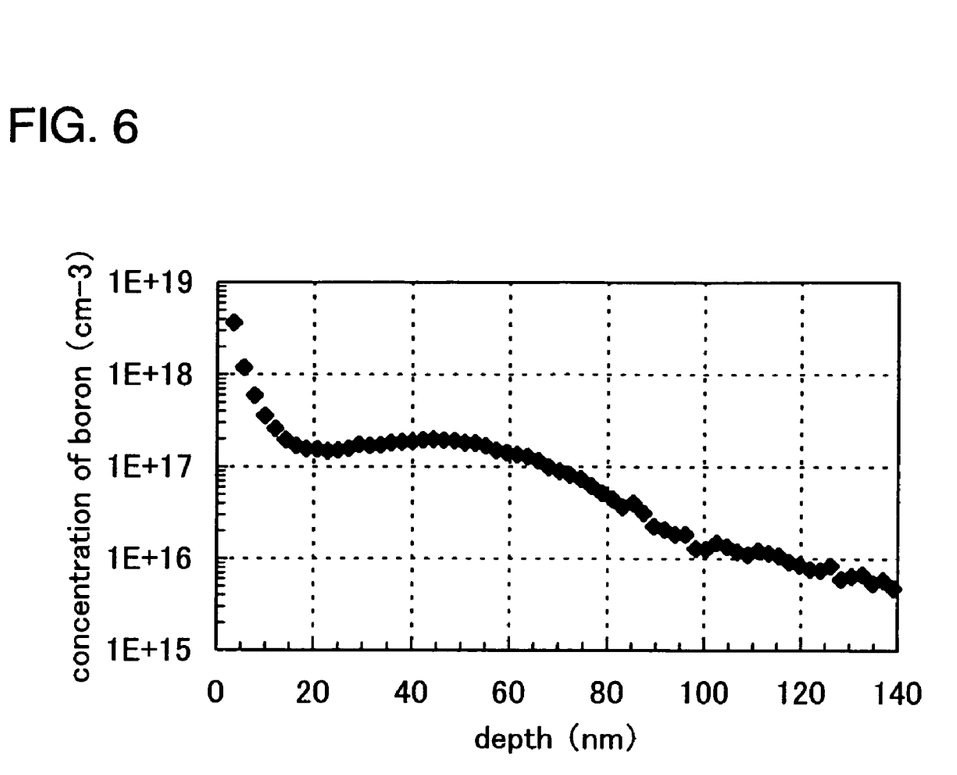
FIG. 6 shows the concentration distribution of boron in a depth direction analyzed by SIMS.

FIG. 6 shows the concentration distribution of boron in a depth direction analyzed by SIMS. The horizontal axis shows the depth (nm), and the vertical axis shows the concentration of boron (cm$-^3$). In FIG. 6, due to a measurement problem, an actual concentration distribution of boron is not reflected in a region to around a depth of 20 nm from a surface. Accordingly, a maximum value of the concentration of boron in a region under a depth of 20 nm is referred to as a peak concentration Y.

Figure 7:
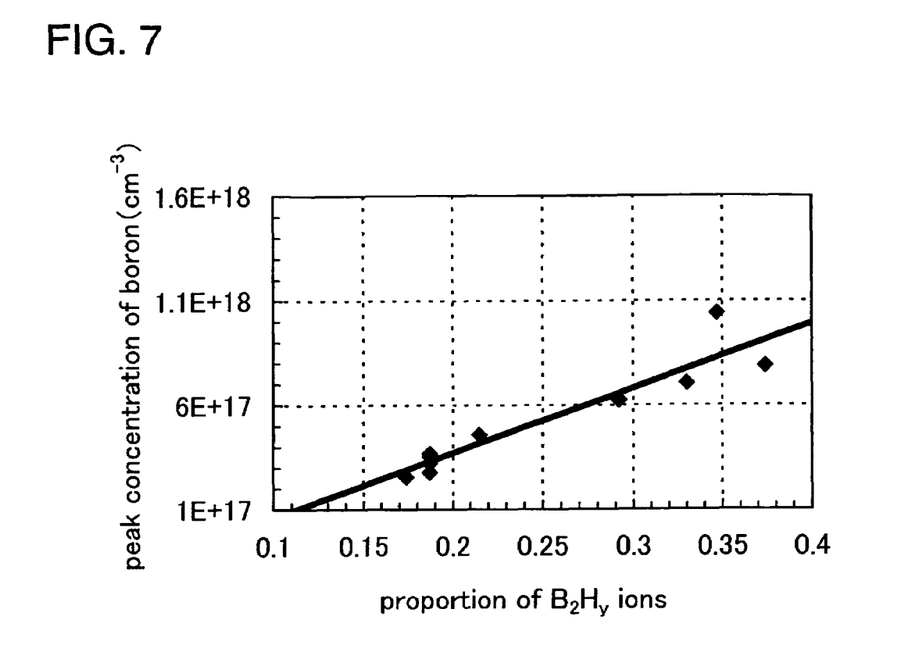
FIG. 7 shows a relation between the proportion of $B_2H_y^+$ ions in total ions in the condition of heavy doping and the peak concentration of boron in the condition of channel doping.

In FIG. 7, the horizontal axis shows the proportion X of $B_2H_y^+$ ions in total ions, the vertical axis shows the peak concentration Y of boron, and a result obtained by plotting values of Y corresponding to values of X is shown. In addition, when a relation of X and Y is shown with collinear approximation, a relational expression, $Y=3.1 \times 10^{18}X-2.5 \times 10^{17}$, can be obtained. This expression corresponds to Formula 1. Further, from Formula 1, a relational expression, $Y=(D_1/(1.3 \times 10^{14}))(3.1 \times 10^{18}X-2.5 \times 10^{17})$, can be obtained, and this corresponds to Formula 1'. $D_1$ denotes an arbitrary dose amount of total ions.

Next, channel doping is performed in the same conditions of the concentration of $B_2H_6$ in a source gas, the dose amount of total ions, and the acceleration voltage as those after the above change. A semiconductor film containing silicon as its main component, which is channel-doped, is used as an active layer (channel formation region). A channel length L, a channel width W, and an LDD length are set to predetermined sizes, and an n-channel thin film transistor in which a gate insulating film is set to have a predetermined thickness is manufactured. Then, a threshold voltage $V_{th}$ (V) thereof is measured. An LDD length is a length in the same direction as a channel length in an LDD region. Note that the LDD region is not necessarily provided. In this embodiment mode, the channel length is 1 μm, the channel length is 20 μm, the LDD length is 0.2 μm, and the thickness of the gate insulating film is 40 nm. As the gate insulating film, an $SiO_xN_y$ film (x>y>0) is used. Alternatively, a silicon oxide film may be used as the gate insulating film.

Figure 8:
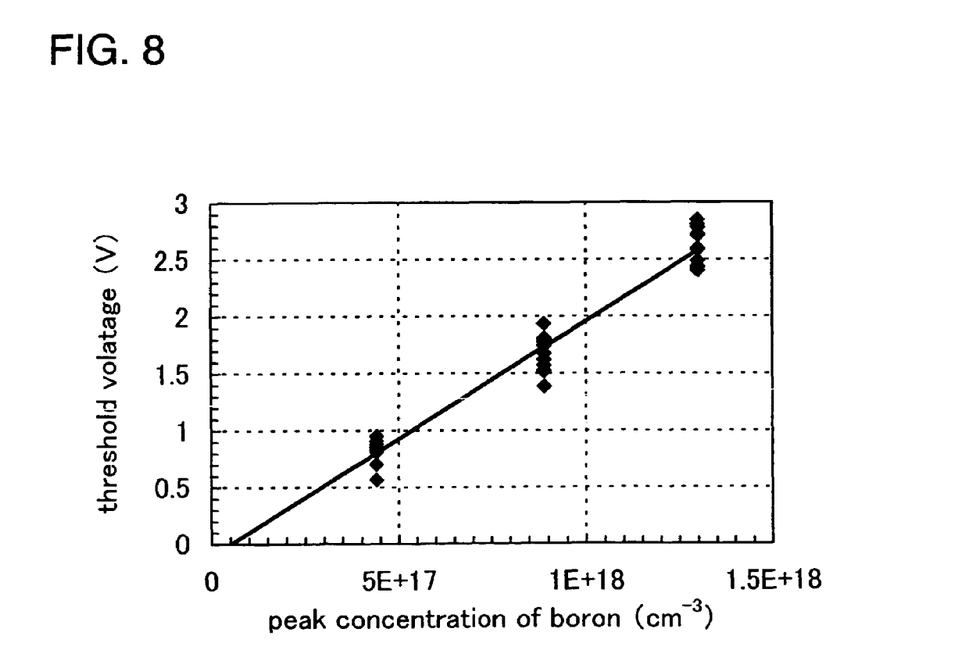
FIG. 8 shows a relation between the threshold voltage of an n-channel thin film transistor and the peak concentration of boron in an active layer.

In FIG. 8, the vertical axis shows the threshold voltage $V_{th}$ of the n-channel thin film transistor, and the horizontal axis shows the peak concentration Y of boron in the semiconductor film containing silicon as its main component, which is the active layer in the n-channel thin film transistor, and a result obtained by plotting values of $V_{th}$ corresponding to values of Y is shown. From the result, when a relation of $V_{th}$ and Y is shown with collinear approximation, a relational expression, $V_{th}=2.1\times10^{-18}Y-0.11$, can be obtained. This corresponds to Formula 2.

Figure 9:
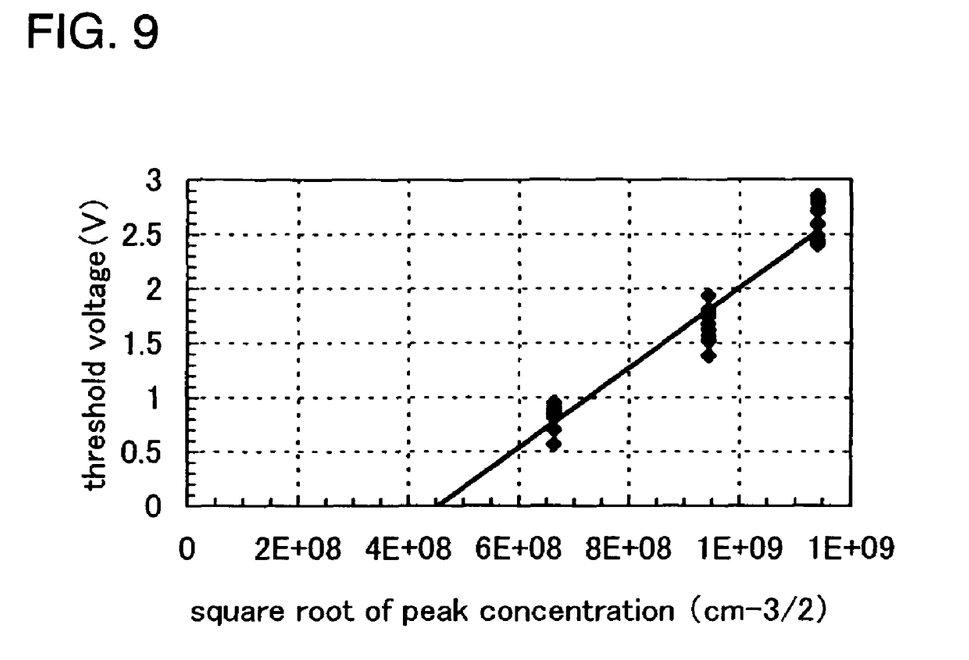
FIG. 9 shows a relation between the threshold voltage of an n-channel thin film transistor and the square root of the peak concentration of boron in an active layer.

In FIG. 9, the vertical axis shows the threshold voltage $V_{th}$ of the n-channel thin film transistor, the horizontal axis shows the square root of the peak concentration Y of boron in the semiconductor film containing silicon as its main component which is the active layer of the n-channel thin film transistor, and a result obtained by plotting values of $V_{th}$ correspondingly to values of the square root of Y is shown. From this result, when a relation between $V_{th}$ and the square root of Y is shown with collinear approximation, a relational expression, $V_{th}=3.7\times10^{-9}Y^{1/2}-1.7$, can be obtained. This also corresponds to Formula 2. Accordingly, it is found that there is not much difference between a correlation coefficient of the relational expression shown in FIG. 9 and that of the relational expression shown in FIG. 8.

In addition, in a MOS structure in which metal, an oxide material, and a semiconductor is laminated, it is known that, in a case where the semiconductor is a p-type, a threshold voltage, in which conductivity of a surface of the semiconductor is reversed, is proportional to the square root of the concentration of an acceptor impurity ($cm^{-3}$) in the semiconductor. In a case where the semiconductor is an n-type, a threshold voltage is proportional to the square root of the concentration of a donor impurity ($cm^{-3}$) in the semiconductor. In consideration of this, it is preferable to select the relational expression obtained from FIG. 9 as Formula 2. However, when comparing the relational expression obtained by FIG. 8 with the relational expression obtained by FIG. 9, there is not much difference between them in a range where the peak concentration Y of boron is high, for example, Y of $5\times10^{17}$ $cm^{-3}$ or more.

Accordingly, relational expressions corresponding to Formula 1, Formula 1', and Formula 2 can each be obtained.

(Embodiment Mode 2)

When an n-channel thin film transistor is manufactured using an ion doping apparatus in a step of channel doping, steps to obtain a dose amount of total ions in channel doping, required to approximate a threshold voltage $V_{th}$ of the n-channel thin film transistor to a predetermined value (in this embodiment mode, +1.0 V), are carried out. The process is described below.

According to Formula 2 obtained in Embodiment Mode 1 of this specification, a peak concentration Y of boron in a semiconductor film (used as an active layer) containing silicon as its main component, required to obtain a threshold voltage of +1.0 V is $5.3\times10^{17}$ $cm^{-3}$.

In the case where a proportion X of $B_2H_y^+$ ions is 0.30, X of 0.30 and Y of $5.3\times10^{17}$ $cm^{-3}$ are assigned to Formula 1' obtained in Embodiment Mode 1; accordingly, $D_1=1.0\times10^{14}$ $cm^{-2}$ can be obtained. From this result, it is found that a dose amount $D_1$ of total ions in channel doping, required to obtain a threshold voltage $V_{th}$, +1.0 V, of the n-channel thin film transistor is $1.0\times10^{14}$ $cm^{-2}$. Note that a source gas used in the channel doping step is $B_2H_6$ diluted with hydrogen to a concentration of 1%, which is used to obtain Formula 1, Formula 1', and Formula 2 in Embodiment Mode 1.

Though the calculation in the case where X is 0.30 as an example, is performed, the dose amount $D_1$ of total ions required to obtain a predetermined threshold voltage varies depending on a proportion X of $B_2H_y^+$ ions. Therefore, by adjusting the dose amount of total ions as the proportion X of $B_2H_y^+$ ions changes, the threshold voltage can be approximate to an aimed value.

Further, when Formula 1' is assigned to Formula 2, a relational expression, $V_{th}=2.1\times10^{-18}$ $(D_1/(1.3\times10^{14}))(3.1\times10^{18}X-2.5\times10^{17})-0.11$ or $V_{th}=3.7\times10^{-9}(D_1/(1.3\times10^{14}))^{1/2}$ $(3.1\times10^{18}X-2.5\times10^{17})^{1/2}-1.7$ can be obtaine relational expression, when values of X and $V_{th}$ are identified, the value of $D_1$ can be obtained.

The ion doping apparatus is, in some cases, additionally provided with an electronic calculator capable of controlling the apparatus. A structure may be used, in which Formula 1', Formula 2, and the above relational expression obtained by assigning Formula 1' to Formula 2 are stored in this electronic calculator and in which, when inputting an aimed threshold voltage $V_{th}$, the dose amount $D_1$ of total ions required to obtain the threshold voltage can be calculated. In addition, a structure may be used, in which the dose amount of total ions can be automatically adjusted to the calculated value by an output signal from the electronic calculator.

The above electronic calculator is connected to a mass spectrometer, and a proportion X of a predetermined ion species in total ions (in this embodiment mode, $B_2H_y^+$) can be calculated based on a measurement result by this mass spectrometer. In addition, a calculated result of a necessary dose amount $D_1$ of total ions is varied depending on the calculated value of X.

The predetermined threshold voltage is not limited to +1.0 V. In a case of an n-channel thin film transistor, the predetermined threshold voltage is set in the range of +0.3 V to +1.5V, preferably in the range of +0.5 V to +1.0 V; accordingly, electric characteristics are improved, and high yield can be achieved.

(Embodiment Mode 3)

After performing channel doping to a semiconductor film containing silicon as its main component by using an ion doping apparatus, steps of obtaining the dose amount of total ions in doping are carried out, which is required to approximate a peak concentration of boron in the semiconductor film obtained by a result of analysis by SIMS to a desired value (in this embodiment mode, $4.4\times10^{17}$ $cm^{-3}$). The steps are described below When a proportion X of $B_2H_y^+$ ions is 0.30, Y of $4.4\times10^{17}$ $cm^{-3}$ is assigned to Formula 1' obtained in Embodiment Mode 1; accordingly, $D_1$ of $8.4\times10^{13}$ $cm^{-2}$ can be obtained. From this result, a dose amount $D_1$ of total ions required to obtain a peak concentration of boron of $4.4\times10^{17}$ $cm^{-3}$ in a semiconductor film containing silicon as its main component is found to be $8.4\times10^{13}$ $cm^{-2}$. Note that a source gas used in the channel doping step is $B_2H_6$ diluted with hydrogen to a concentration of 1%, which is used to obtain Formula 1 and Formula 1' in Embodiment Mode 1.

Though the calculation in the case where X is 0.30 as an example, is performed, the dose amount $D_1$ of total ions required to obtain a predetermined peak concentration of boron is varied depending on the proportion X of $B_2H_y^+$ ions. Therefore, by adjusting the dose amount $D_1$ of total ions as the proportion X of the $B_2H_y^+$ ions changes, the peak concentration of boron in the semiconductor film containing silicon as its main component can be approximated to a desired value.

A structure may be used, in which the Formula 1' is stored in an electronic calculator provided in an ion doping apparatus and in which, when inputting a predetermined peak concentration Y of boron, the dose amount $D_1$ of total ions required to obtain the concentration can be calculated. In addition, a structure in which the dose amount of total ions can be automatically adjusted to the calculated value by an output signal from the electronic calculator may be used.

In accordance with the process described in this embodiment mode, ten samples are manufactured by performing channel doping while adjusting the dose amount of total ions required to obtain the peak concentration of boron of $4.4 \times 10^{17}$ cm$^{-3}$. Then, peak concentrations of boron of the manufactured samples are analyzed by SIMS. In channel doping step, $B_2H_6$ diluted with hydrogen to a concentration of 1% is used as a source gas, and an acceleration voltage is set at 25 kV. As the result, three samples have peak concentrations of boron in a range of $3 \times 10^{17}$ cm$^{-3}$ or more and less than $4 \times 10^{17}$ cm$^{-3}$, six samples have peak concentrations of boron in a range of $4 \times 10^{17}$ cm$^{-3}$ or more and less than $\times 10^{17}$ cm$^{-3}$, and one sample has a peak concentration of boron in a range of $5 \times 10^{17}$ cm$^{-3}$ or more and less than $6 \times 10^{17}$ cm$^3$.

On the other hand, ten samples are manufactured by a conventional method in which channel doping is performed to a semiconductor film containing silicon as its main component with an ion doping apparatus, and peak concentrations of boron is analyzed by SIMS. In the channel doping, $B_2H_6$ diluted with hydrogen to a concentration of 1% is used as a source gas, and an acceleration voltage is set at 25 kV. In addition, a dose amount of total ions is fixed at $1 \times 10^{14}$ cm$^{-2}$. As the result, three samples have peak concentrations of boron in the range of $2 \times 10^{17}$ cm$^{-3}$ or more and less than $3 \times 10^{17}$ cm$^{-3}$, three samples have peak concentrations of boron in a range of $3 \times 10^{17}$ cm$^{-3}$ or more and less than $4 \times 10^{17}$ cm$^{-3}$, two samples have peak concentrations of boron in the range of $5 \times 10^{17}$ cm$^{-3}$ or more and less than $6 \times 10^{17}$ cm$^{-3}$, one sample has a peak concentration of boron in a range of $6 \times 10^{17}$ cm$^{-3}$ or more and less than $7 \times 10^{17}$ cm$^{-3}$, and one sample has a peak concentration of boron in a range of $8 \times 10^{17}$ cm$^{-3}$ or more and less than $9 \times 10^{17}$ cm$^{-3}$.

In comparing the both results with each other, it is clear that the variation of the peak concentration of boron in the case of using the present embodiment mode can be smaller than that of the case where the conventional method is used, and that a value close to the predetermined peak concentration of boron can be obtained according to the present embodiment mode.

(Embodiment Mode 4)

A process for changing a source gas to be used having a concentration of $B_2H_6$ of 5% to that having a concentration of 1% in Embodiment Mode 1 of this specification is described below.

Supply of the source gas ($B_2H_6$ diluted with hydrogen to a concentration of 5%) into the plasma generating portion 104 of the ion doping apparatus shown in FIG. 1 is stopped, and hydrogen is substituted as a supplied gas. Then, hydrogen plasma is generated, and a dummy treatment in which the dummy substrate placed on the stage 110 in the treatment chamber 109 is irradiated with the ion beam 108 extracted through the electrode portion 107 is performed for one hour. The dummy substrate may be any of a glass substrate or a silicon substrate. At that time, the dose amount is set at $3 \times 10^{15}$ cm$^{-2}$, and the acceleration voltage is set at 50 kV.

Then, supply of hydrogen to the plasma generating portion 104 is stopped, and the treatment chamber 109 is exhausted for one hour by using the vacuum pumping system 112. Subsequently, the source gas in which $B_2H_6$ is diluted with hydrogen to a concentration of 1% is supplied to the plasma generating portion 104 to generate plasma, and a dummy treatment in which the above substrate is irradiated with the ion beam 108 extracted through the electrode portion 107 is performed for 30 minutes. At that time, a dose amount of total ions is set at $1.3 \times 10^{14}$ cm$^{-2}$, and an acceleration voltage is set at 25 kV.

Then, the dummy substrate on the stage 110 is converted to a glass substrate over which a semiconductor film containing silicon as its main component is formed. The semiconductor film is doped, without changing conditions such as the dose amount of total ions and the acceleration voltage.

In this embodiment mode, a dummy treatment, before the semiconductor film is actually doped, only requires an hour and a half.

[Embodiment]

Steps of manufacturing a thin film transistor by using the invention disclosed in this specification will be described below.

Figure 10A:
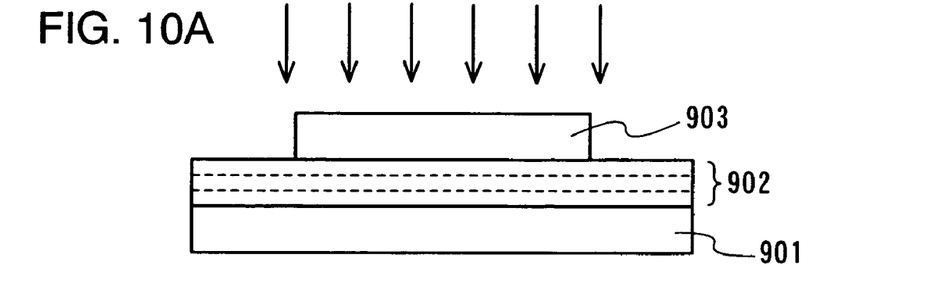
FIGS. 10A to 10D show manufacturing steps of a thin film transistor.

As shown in FIG. 10A, a base layer 902 is formed over a substrate 901 having an insulating surface. A base layer 902 is formed of a plurality of films and can have a structure including two or more of a silicon nitride film containing oxygen, a silicon oxide film containing nitrogen, a silicon oxide film, or a silicon nitride film. Either or both of a film containing high-melting point metal having a melting point of 2000° C. or more (for example, tungsten) as its main component and a film containing a compound of the high-melting point metal as its main component can be further provided between the substrate 901 and the base layer 902 or between two films of the films forming the base layer 902.

A semiconductor film containing silicon as it main component, for example, a crystalline or amorphous silicon film, is formed over the base layer 902, and a pattern 903 having a predetermined shape is formed from this semiconductor film by a photolithography step.

Channel doping is performed to the pattern 903 with an ion doping apparatus as described in FIG. 1. In the channel doping, $B_2H_6$ diluted with hydrogen to a concentration of 1% is used as a source gas, and an acceleration voltage is 25 kV. The dose amount of total ions is set at the value obtained in accordance with Embodiment Mode 2 or Embodiment Mode 3 in this specification. By using the invention disclosed in this specification, when the dose amount of total ions is set, a predetermined peak concentration of boron or a predetermined threshold voltage can be obtained easily.

After the channel doping of the semiconductor film is performed before forming the pattern 903, the pattern 903 may be formed by a photolithography step.

Figure 10B:
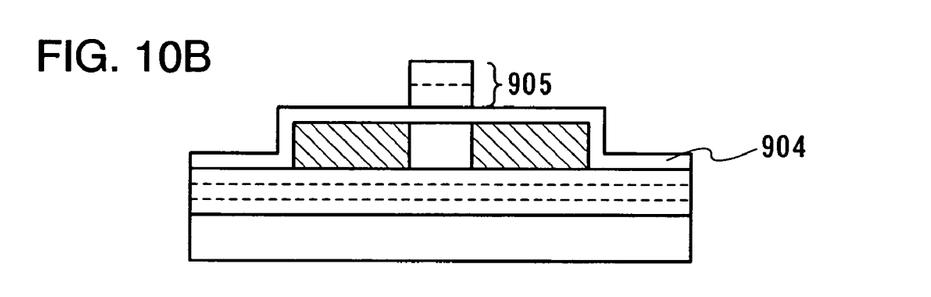

Subsequently, a gate insulating film 904 is formed to cover the pattern 903 as shown in FIG. 10B. Further, a conductive layer is formed over the gate insulating film 904. This conductive layer is formed of a plurality of films and can have a structure including a metal film of titanium, niobium, tantalum, tungsten, molybdenum, chromium, aluminum, or copper. In addition to the metal film, a conductive metal nitride film can be used. Then, a gate electrode 905 having a predetermined shape is formed from this conductive layer by using a photolithography step.

Next, a portion of the pattern 903 shown with diagonal lines is doped with phosphorus using the gate electrode 905 as a mask by using an ion doping apparatus. At this time, $PH_3$ diluted with hydrogen to a concentration of 5% is used as a source gas, the dose amount of total ions is set at $2.5 \times 10^{13}$ cm$^{-2}$, and the acceleration voltage is set at 80 kV. In this doping, the dose amount of total ions can be set by applying the invention disclosed in this specification so that a peak concentration of phosphorus in the pattern 903 can have a predetermined value.

Figure 10C:
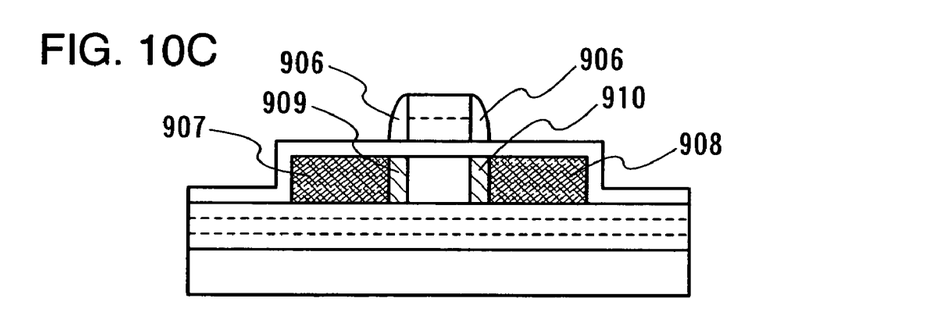

An insulating layer for forming a sidewall is formed to cover at least a side surface of the gate electrode 905, over the gate insulating film 904. This insulating layer can have a structure including either or both of a silicon oxide film and a silicon oxide film containing nitrogen. By performing anisotropic etching to this insulating layer, a sidewall 906 shown in FIG. 10C is selectively formed.

Doping of phosphorus is again performed by using the gate electrode 905 and the sidewall 906 as masks. At this time, $PH_3$ diluted with hydrogen to a concentration of 5% is used as a source gas, the dose amount of total ions is set at $3.0\times10^{15}$ $cm^{-2}$, and the acceleration voltage is set at 20 kV. As the result, since a region overlapping with the sidewall 906 in the pattern 903 is prevented from being doped with phosphorus, source and drain regions 907 and 908, and LDD regions (low concentration impurity regions) 909 and 910 are formed in the pattern 903. A portion of the pattern 903, which is below the gate electrode 905 and between the LDD regions 909 and 910, is a channel formation region.

Figure 10D:
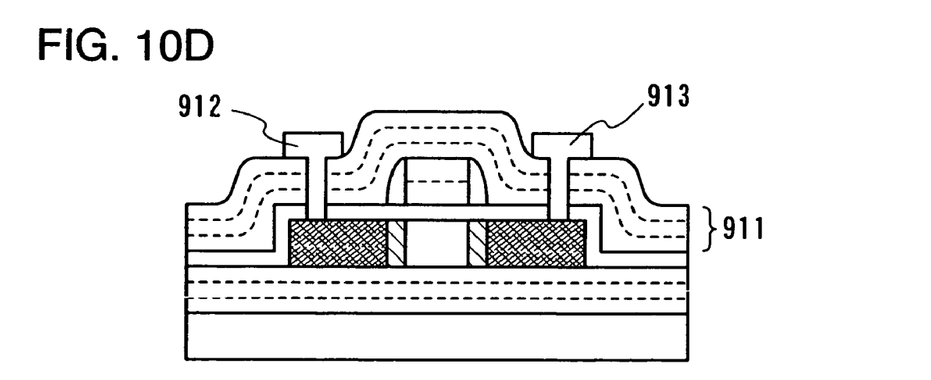

Next, an interlayer insulating layer 911 is formed as shown in FIG. 10D. The interlayer insulating layer 911 is formed of a plurality of films and can have a structure including two or more of a silicon nitride film containing oxygen, a silicon oxide film containing nitrogen, a silicon oxide film, or a silicon nitride film.

Anisotropic etching is performed to the interlayer insulating layer 911 and the gate insulating film 904 to form contact holes to partially expose the source and drain regions 907 and 908. Then, wirings 912 and 913 are formed over the interlayer insulating layer 911. The wirings 912 and 913 can be formed of a plurality of films including a film containing metal as its main component or a conductive film containing a metal compound. The wirings 912 and 913 are each electrically connected to either the source or drain region 907 or 908 through the contact holes.

In accordance with the above described steps, an n-channel thin film transistor, in which a channel length, a channel width, and an LDD length each have predetermined sizes and a gate insulating film has a predetermined thickness, can be manufactured.

The present application is based on Japanese Priority Application No. 2005-034719 filed on Feb. 10, 2005 with the Japan Patent Office, the entire contents of which are hereby incorporated by reference.

What is claimed is:

1. A doping method comprising the steps of: obtaining a proportion X (0<X<1) of ions of a compound including a donor impurity or an acceptor impurity in total ions from mass spectrum by generating plasma using a first source gas in which the compound including the donor impurity or the acceptor impurity is diluted with a diluent gas made of hydrogen or a rare gas to a first concentration of 5% to 40% in an ion doping apparatus, analyzing a peak concentration Y of the compound including the donor impurity or the acceptor impurity in a first processing object which is doped with the ions of the compound including the donor impurity or the acceptor impurity by the ion doping apparatus using a second source gas in which the compound including the donor impurity or the acceptor impurity is diluted with the diluent gas to a second concentration lower than the first concentration, referring a dose amount of total ions as $D_0$ and setting an acceleration voltage at a value, obtaining a dose amount $D_1$ of total ions from a relational expression, $Y=(D_1/D_0)(aX+b)$, wherein a and b are assumed to be real numbers, and doping a second processing object with the donor impurity or the acceptor impurity by the ion doping apparatus using a third source gas, wherein a dose amount of total ions is set at $D_1$, and an acceleration voltage is set at the value.

2. The doping method according to claim 1, wherein the peak concentration Y is analyzed by secondary ion mass spectrum (SIMS) analysis.

3. The doping method according to claim 1, wherein a plasma treatment is performed to a dummy substrate using plasma of the diluent gas for a predetermined period while the first source gas diluted to the first concentration is changed to the second source gas diluted to the second concentration.

4. The doping method according to claim 1, wherein the compound of the acceptor impurity is $B_2H_6$ (diborane), and the ions of the compound including the acceptor impurity is $B_2H_y^+$ ions (y is a positive integer).

5. The doping method according to claim 1, wherein the dose amount $D_1$ is obtained by an electronic calculator.

6. A doping method comprising the steps of:

obtaining a proportion X of ions of a compound including a donor impurity or an acceptor impurity in total ions from mass spectrum by generating plasma using a first source gas in which the compound including the donor impurity or the acceptor impurity is diluted with a diluent gas made of hydrogen or a rare gas to a first concentration of 5% to 40% in an ion doping apparatus; and analyzing a peak concentration Y of the compound including the donor impurity or the acceptor impurity in a first processing object which is doped with ions of the compound including the donor impurity or the acceptor impurity by the ion doping apparatus using a second source gas in which the compound including the donor impurity or the acceptor impurity is diluted with the diluent gas to a second concentration lower than the first concentration, referring a dose amount of total ions to be $D_0$ and setting an acceleration voltage at a value, obtaining a dose amount $D_1$ of total ions from a first relational expression, $Y=(D_1/D_0)(aX+b)$, and from a second relational expression, $V_{th}=cY^{1/2}+d$, wherein a, b, c and d are assumed to be real numbers, and doping a second processing object with the donor impurity or the acceptor impurity by the ion doping apparatus using a third source gas, wherein a dose amount of total ions is set at $D_1$, and an acceleration voltage is set at the value, and wherein Vth is a threshold voltage of a field effect transistor manufactured by using the second processing object which is doped with the donor impurity or the acceptor impurity.

7. The doping method according to claim 6, wherein the peak concentration Y is analyzed by secondary ion mass spectrum (SIMS) analysis.

8. The doping method according to claim 6, wherein a plasma treatment is performed to a dummy substrate using plasma of the diluent gas for a predetermined period while the first source gas diluted to the first concentration is changed to the second source gas diluted to the second concentration.

9. The doping method according to claim 6, wherein the compound of the acceptor impurity is $B_2H_6$ (diborane), and the ions of the compound including the acceptor impurity is $B_2H_y^+$ ions (y is a positive integer).

10. The doping method according to claim 6, wherein the dose amount $D_1$ is obtained by an electronic calculator.

11. A manufacturing method of a field effect transistor comprising the steps of:

obtaining a proportion X ($0<X<1$) of ions of a compound including a donor impurity or an acceptor impurity in total ions from mass spectrum by generating plasma using a first source gas in which the compound including the donor impurity or the acceptor impurity is diluted with a diluent gas made of hydrogen or a rare gas to a first concentration of 5% to 40% in an ion doping apparatus, analyzing a peak concentration Y of the compound including the donor impurity or the acceptor impurity in a first processing object which is doped with the ions of the compound including the donor impurity or the acceptor impurity by the ion doping apparatus using a second source gas in which the compound including the donor impurity or the acceptor impurity is diluted with the diluent gas to a second concentration lower than the first concentration, referring to a dose amount of total ions as $D_0$ and setting an acceleration voltage at a value, obtaining a dose amount $D_1$ of total ions from a relational expression, $Y=(D_1/D_0)(aX+b)$, wherein a and b are assumed to be real numbers, and doping a second processing object with the donor impurity or the acceptor impurity by the ion doping apparatus using a third source gas, wherein a dose amount of total ions is set at $D_1$, and an acceleration voltage is set at the value.

12. The manufacturing method of the field effect transistor according to claim 11, wherein the peak concentration Y is analyzed by secondary ion mass spectrum (SIMS) analysis.

13. The manufacturing method of the field effect transistor according to claim 11, wherein a plasma treatment is performed to a dummy substrate using plasma of the diluent gas for a predetermined period while the first source gas diluted to the first concentration is changed to the second source gas diluted to the second concentration.

14. The manufacturing method of the field effect transistor according to claim 11, wherein the compound of the acceptor impurity is $B_2H_6$ (diborane), and the ions of the compound including the acceptor impurity is $B_2H_y^+$ ions (y is a positive integer).

15. The manufacturing method of the field effect transistor according to claim 11, wherein the dose amount $D_1$ is obtained by an electronic calculator.

16. A manufacturing method of a field effect transistor comprising the steps of:

obtaining a proportion X of ions of a compound including a donor impurity or an acceptor impurity in total ions from mass spectrum by generating plasma using a first source gas in which the compound including the donor impurity or the acceptor impurity is diluted with a diluent gas made of hydrogen or a rare gas to a first concentration of 5% to 40% in an ion doping apparatus; and analyzing a peak concentration Y of the compound including the donor impurity or the acceptor impurity in a first processing object which is doped with ions of the compound including the donor impurity or the acceptor impurity by the ion doping apparatus using a second source gas in which the compound including the donor impurity or the acceptor impurity is diluted with the diluent gas to a second concentration lower than the first concentration, referring a dose amount of total ions to be $D_0$ and setting an acceleration voltage at a value, obtaining a dose amount $D_1$ of total ions from a first relational expression, $Y=(D_1/D_0)(aX+b)$, and from a second relational expression, $V_{th}=cY^{1/2}+d$, wherein a, b, c and d are assumed to be real numbers, and doping a second processing object with the donor impurity or the acceptor impurity by the ion doping apparatus using a third source gas, wherein a dose amount of total ions is set at $D_1$, and an acceleration voltage is set at the value, and wherein Vth is a threshold voltage of the field effect transistor manufactured by using the second processing object which is doped with the donor impurity or the acceptor impurity.

17. The manufacturing method of the field effect transistor according to claim 16, wherein the peak concentration Y is analyzed by secondary ion mass spectrum (SIMS) analysis.

18. The manufacturing method of the field effect transistor according to claim 16, wherein a plasma treatment is performed to a dummy substrate using plasma of the diluent gas for a predetermined period while the first source gas diluted to the first concentration is changed to the second source gas diluted to the second concentration.

19. The manufacturing method of the field effect transistor according to claim 16, wherein the compound of the acceptor impurity is $B_2H_6$ (diborane), and the ions of the compound including the acceptor impurity is $B_2H_y^+$ ions (y is a positive integer).

20. The manufacturing method of the field effect transistor according to claim 12, wherein the dose amount $D_1$ is obtained by an electronic calculator.

* * * * *